United States Patent [19]

Sacchi et al.

[11] Patent Number: 5,352,944
[45] Date of Patent: Oct. 4, 1994

[54] APPARATUS AND METHOD FOR PRODUCING A TEMPERATURE-INDEPENDENT CURRENT SIGNAL IN AN AUTOMATIC GAIN CONTROL CIRCUIT

[75] Inventors: Fabrizio Sacchi, Pavia; Maurizio Zuffada, Milan; Gianfranco Vai, Pavia; David Moloney, Cornaredo, all of Italy

[73] Assignee: SGS-Thomson Microelectronics s.r.l., Milan, Italy

[21] Appl. No.: 41,517

[22] Filed: Apr. 1, 1993

Related U.S. Application Data

[63] Continuation of Ser. No. 806,905, Dec. 12, 1991, abandoned.

[30] Foreign Application Priority Data

Dec. 12, 1990 [EP]  European Pat. Off. ........ 90830579.0

[51] Int. Cl.$^5$ ............................................. H03F 3/45
[52] U.S. Cl. .................................. 307/494; 307/261; 307/362; 307/310; 307/492; 307/503; 328/145
[58] Field of Search ............... 307/261, 362, 492, 493, 307/494, 499, 500, 503, 310; 328/145

[56] References Cited

U.S. PATENT DOCUMENTS

| | | | |
|---|---|---|---|
| 3,170,125 | 2/1965 | Thompson | 307/494 |
| 3,309,615 | 3/1967 | Baldwin et al. | 307/494 |
| 3,643,107 | 2/1972 | Gilbreath | 307/494 |
| 3,668,440 | 6/1972 | Davis et al. | . |
| 4,101,841 | 7/1978 | Okada et al. | . |
| 4,385,364 | 5/1983 | Main | 307/492 |
| 4,413,235 | 11/1983 | Jason | . |
| 4,439,696 | 3/1984 | Yokoya | 307/494 |
| 5,021,730 | 6/1991 | Smith | 307/261 |
| 5,057,717 | 10/1991 | Kimura | 307/492 |
| 5,065,112 | 11/1991 | Ishiguro et al. | 307/494 |
| 5,115,154 | 5/1992 | Terado | 307/494 |

Primary Examiner—Timothy P. Callahan
Assistant Examiner—Terry D. Cunningham
Attorney, Agent, or Firm—Seed and Berry

[57] ABSTRACT

A circuit particularly useful in AGC systems, produces an output current which is proportional to the difference between a signal voltage and a reference voltage which is practically independent of temperature. By being a function of a ratio among actual values of integrated resistances and of a ratio among substantially temperature-stable voltages. The effects of temperature dependent value of integrated resistances and of temperature-dependent electrical characteristics of integrated semiconductor devices are compensated in order to produce the desired temperature-independent output current which may usefully be utilized for implementing an automatic gain control.

14 Claims, 2 Drawing Sheets

APPARATUS AND METHOD FOR PRODUCING A TEMPERATURE-INDEPENDENT CURRENT SIGNAL IN AN AUTOMATIC GAIN CONTROL CIRCUIT

CROSS-REFERENCE TO RELATED APPLICATION

This application is a continuation of U.S. patent application Ser. No. 07/806,905, filed Dec. 12, 1991, now abandoned.

TECHNICAL FIELD

The present invention relates to an integrated circuit for the generation of a current proportional to the difference between a signal voltage and a reference voltage, and independent of temperature and of variations in the integrated resistors. The circuit is particularly useful, although not exclusively, for effecting automatic gain control in signal processing systems.

BACKGROUND OF THE INVENTION

The input signal of a signal processing system, especially if this comes from magnetic transducers, mechanical transducers, tuners, etc., can be subject to large amplitude variations. Variations of 30–60 dB can occur under various circumstances. It is therefore useful to equip the system for processing the signal with a device for automatic gain control, commonly denoted by the acronym AGC, which determines a variable amplification of the input signal so as to obtain an amplified signal with constant amplitude at the output.

Some integrated circuit components have highly temperature-dependent intrinsic electrical characteristics. Notably, the junction $V_{BE}$ in silicon is inversely proportional to temperature, while the value of an integrated resistor is directly proportional to temperature.

In AGC systems and in analogous integrated circuits these variations in the electrical characteristics relative to the nominal design values, can often determine intolerable inaccuracies in the operation of these very sensitive circuits.

SUMMARY OF THE INVENTION

Hence it is a main aim of the present invention to provide an integrated circuit capable of generating a current proportional to the difference between a signal voltage and a reference voltage, and which is substantially independent of temperature variations.

A further aim of the invention is to provide an improved AGC circuit.

The circuit of the invention for generating a current proportional to the difference between a signal voltage and a reference voltage, and independent of temperature, comprises a differential input circuit having a first input terminal to which is applied the signal voltage and a second input terminal to which is applied a reference voltage stable relative to temperature. The circuit is formed from a pair of transistors connected in a common-emitter configuration, and each transistor is biased by means of an individual current generator connected between a first circuit supply node and the emitter of the relevant transistor. The two current generators are substantially identical and essentially deliver a current inversely proportional to a certain integrated resistor value (i.e., inversely proportional to the temperature coefficient of the integrated resistors) and the emitters of the two transistors are connected across an integrated resistor in order to raise the value of the trigger threshold of the differential, thereby increasing the zone of linearity in order to secure the conversion of the potential difference between the signal voltage and the reference voltage into a difference between the currents flowing through the two branches of the differential circuit.

Between a second (virtual) supply node and the respective collectors of the two transistors of the differential input circuit, are connected two identical, forward-biased diodes which respectively function as load for the respective transistor. In this way, a differential voltage, which represents a current/voltage conversion, in accordance with a logarithmic law, of the currents which flow through the two branches of the differential circuit, is obtained between the output (collector) nodes of the differential input circuit.

This differential voltage is applied to the inputs of a first differential stage, across which is forced a bias current generated by a circuit capable of generating a current directly proportional to temperature and inversely proportional to the value of at least one integrated resistor.

Any one of many suitable circuits for generating a current proportional to temperature and inversely proportional to the value of an integrated resistor are acceptable. According to a preferred embodiment, a bias current with these characteristics can conveniently be derived from a "band-gap" circuit which is normally present in integrated circuits for signal processing. A band-gap circuit per se is known to those of ordinary skill in the art, being widely used as source of a constant voltage with value substantially independent of temperature variations and of the supply voltage; however, such a band-gap is modified and used to provide a temperature-dependent current output signal.

The differential output voltage produced by such a first differential stage is applied to the inputs of a second differential stage able to carry out a voltage/current conversion, in accordance with an exponential law, in order to generate the desired output current across an output terminal, as a function of the differential voltage applied to the individual inputs. This second differential stage is biased by means of a generator of constant current which is essentially independent of temperature variations.

The output current is equal to the product of the value of said constant bias current of the second differential stage, and which is independent of temperature variations, and of an exponential function of a ratio between integrated resistors (which is therefore substantially invariable with respect to temperature), of the logarithm of a pure number and of the ratio between voltages which are substantially temperature-stable, as will be demonstrated in more detail later.

The various aspects and advantages of the circuit which is the subject of the present invention will become clearer through the following description and reference to the attached drawings.

DETAILED DESCRIPTION OF THE INVENTION

Figure 1:
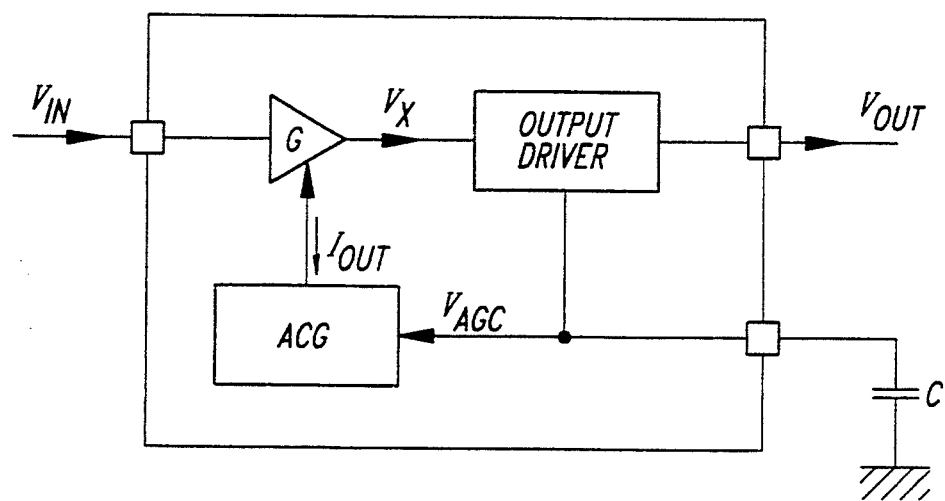
FIG. 1 is a simplified block diagram of a system for automatic gain control (AGC), as is known in the prior art.

A typical simplified diagram of a prior art system furnished with AGC is shown in FIG. 1. The signal at the input to the AGC circuit is a DC voltage $V_{AGC}$, which is proportional to the amplitude of the signal $V_X$. The AGC circuit supplies an output current $I_{out}$ which regulates the gain of the amplifier G, thereby keeping the amplitude of the signal $V_X$ constant independently of the amplitude of the input signal $V_{IN}$.

Figure 2:
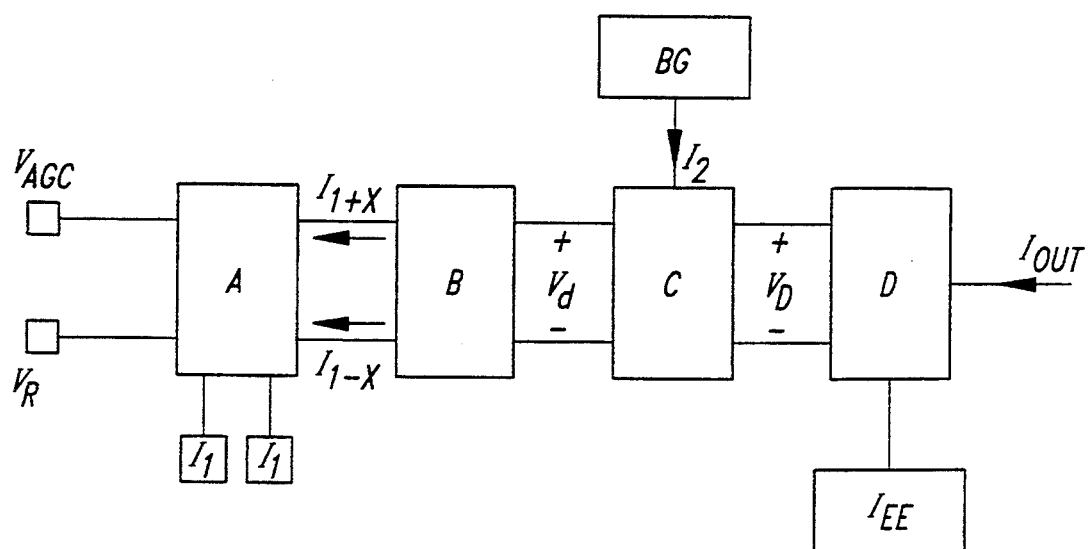
FIG. 2 is a functional block diagram of the circuit of the invention.

With reference to FIG. 2, the circuit of the invention operationally comprises a first block A which performs a linear/logarithmic conversion of the differential voltage $V_{AGC}-V_R$ into currents $I_1+x$ and $I_1-x$.

The block B performs a current/voltage conversion in accordance with a logarithmic law of the currents $I_1+x$ and $I_1-x$ into the differential voltage $V_d$.

The block C is a first differential stage across which is driven by a bias current $I_2$ generated by circuit BG. The circuit BG is able to generate a current $I_2$ directly proportional to temperature and inversely proportional to the value of at least one integrated resistor. The block C operationally performs a voltage/voltage conversion, in accordance with an exponential law, of the differential voltage $V_d$ applied to the inputs, into a differential output voltage $V_D$.

The block D is a second differential stage, across which is driven a bias current $I_{EE}$, which is essentially independent of temperature. Operationally, the block D performs a voltage/current conversion, in accordance with an exponential law, between the differential voltage $V_D$ applied to the individual inputs, into an output current $I_{OUT}$. The Current $I_{OUT}$ provided by the inventive circuit is a function of the difference between the voltages $V_{AGC}$ and $V_R$ and is thus independent of temperature variations, as will now be explained.

Figure 3:
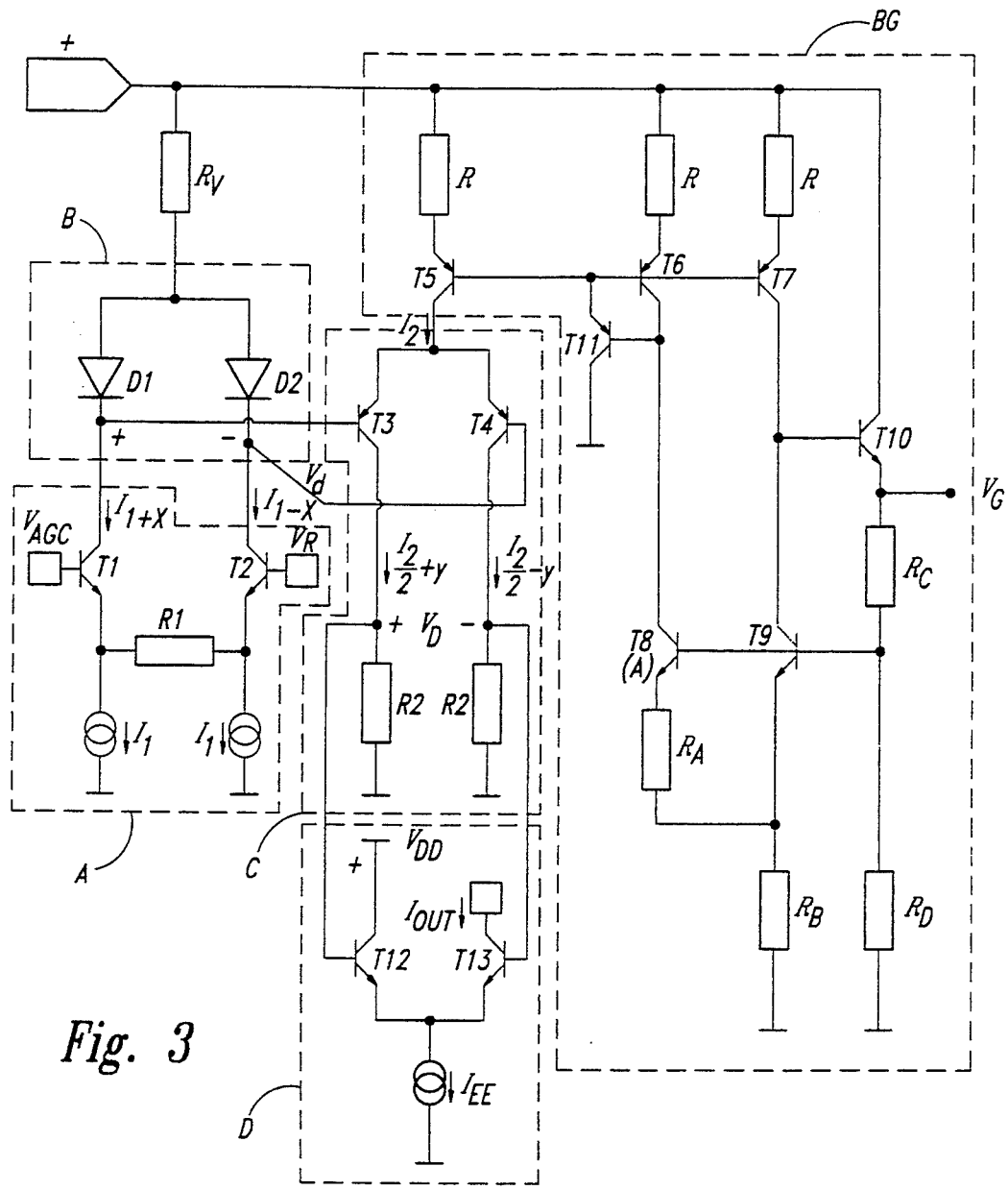
FIG. 3 is a circuit diagram according to a preferred embodiment of the circuit of FIG. 2.

A preferred embodiment of the invention is represented by the circuit of FIG. 3, in which the relevant circuit blocks A, B, C, D and BG are identified by means of dashed lines.

One circuit that is usable for circuit BG is a modified band-gap circuit. A typical, known band-gap circuit (BG) consists only of the transistors T6, T7, T8, T9, T10 and T11 and of the resistors $R_A$, $R_B$, $R_C$ and $R_D$. This circuit of six transistors and four resistors is commonly present in integrated circuits and is widely used to produce, on the respective output terminal, a constant voltage $V_G$, which is extremely temperature-stable and independent of variations in supply voltage.

This common circuit is modified by adding a transistor T5 and, optionally, three resistors R as shown in FIG. 3. The current across the transistors T6 and T7 of the band-gap circuit can be mirrored, by means of a transistor T5, and it can be demonstrated that this current I2 is given by the relationship:

$$I_2 = \frac{KT}{qR_A} \ln A \quad (1)$$

where K is Boltzman's constant, q is the electron charge, T is the temperature in degrees Kelvin and A is the area of the transistor T8. The resistors R connected between the emitters of the transistors T6, T7 and T5 can optionally be introduced and values selected with the aim of increasing the precision of the mirroring ratios, in accordance with circuit design considerations well known to those of ordinary skill in the art.

According to this preferred embodiment, the circuit BG is a modified band-gap circuit used to generate a bias current $I_2$ essentially proportional to temperature (T) and inversely proportional to the value of at least one integrated resistor ($R_A$), which current is forced across a first differential stage (block C) formed by the transistors T3 and T4 and by the relevant load resistors $R_2$.

The second differential stage, or differential output stage (block D), is composed of the transistors T12 and T13 and of the relevant bias current $I_{EE}$ generator which is essentially independent of temperature. Numerous temperature-independent current generating circuits are fully described in the prior art. Any one of many suitable circuits are acceptable. The work entitled "Analysis and Design of Analog Integrated Circuits" by P. R. Gray, R. G. Meyer, Publisher J. Wiley & Sons, contains, on pp. 248-259, a description of numerous suitable temperature-independent current and voltage-generating circuits for use as block D, which description is incorporated herein by express reference. Other circuits of this type are moreover well known to those of ordinary skill in the art and hence a repeated description of these circuits is superfluous.

The differential input circuit (block A) is composed of the pair of transistors T1 and T2, of the integrated resistor $R_1$ connected between the emitters of the two transistors and of the pair of current $I_1$ generators able to supply a current given by the following relationship:

$$I_1 = \frac{V_{REF}}{R_E} \quad (2)$$

where $V_{REF}$ is a constant, temperature-independent voltage, $V_R$, and $R_E$ is an integrated resistor $R_1$, the value of which is hence subject to temperature variations. As will be clear, a suitable voltage $V_{REF}$ will be able to be conveniently derived from the voltage $V_G$ available, within the integrated circuit, on the respective terminal of the circuit BG if a modified band-gap circuit is used. That is, $V_G$ is provided as an input to block A as $V_R$.

The block B represents the respective loads of the two transistors T1 and T2 of the differential input circuit, D1 and D2, respectively. The two diodes D1 and D2 are respectively connected to the respective collectors of the two transistors T1 and T2 and to a virtual supply node of the circuit. The resistor $R_V$ has the effect of producing a voltage drop sufficient to maintain the pair of transistors T3 and T4 of the first differential stage (block C) in an appropriate zone of the dynamic operating characteristic.

ANALYSIS OF THE OPERATION OF THE CIRCUIT

In comparing a temperature-stable reference voltage $V_R$, which, in one embodiment is derived from the constant voltage $V_G$ supplied by the band-gap circuit of BG with a signal voltage $V_{AGC}$, and if the condition:

$$R_1 I_1 \gg V_T \left( \text{where } V_T = \frac{KT}{q} \right)$$

is valid, it is possible to write:

$$\frac{V_{AGC} - V_R}{R_1} = x \quad (3)$$

The differential voltage $V_d$ at the input of the first differential stage T3–T4 (block C) is given by the difference between the $V_{BE}$ of the diodes D1 and D2:

$$V_d = V_{BE1} - V_{BE2} = V_T \ln \frac{I_1 + x}{I_1 - x} \quad (4)$$

The equation which links the current y to the differential input voltage of the differential $V_d$ is as follows:

$$y = \frac{I_2}{2} \tanh \frac{V_d}{2V_T} \quad (5)$$

Substituting (4) into (5) gives:

$$y = \frac{I_2}{2} \frac{V_{AGC} - V_R}{R_1 I_1} \quad (6)$$

Then substituting equation (1) for $I_2$ and equation (2) for $I_1$, gives:

$$V_D = 2R_2 y = 2R_2 \frac{KT}{qRA} \ln(A) \frac{1}{2} \frac{V_{AGC} - V_R}{R_1} \frac{R_E}{V_{REF}} \quad (7)$$

The following equation:

$$I_{OUT} = I_{EE} \frac{1}{1 + \exp \frac{V_D}{V_T}} \quad (8)$$

is valid for the output current $I_{OUT}$ produced by the second differential stage T12–T13 (block D), and if $V_D \gg V_T$:

$$I_{OUT} = I_{EE} \exp \left( -\frac{V_D}{V_T} \right) \quad (9)$$

is obtained.

Substituting equation (7) into equation (9):

$$I_{OUT} = I_{EE} \exp \left( -\frac{R_2}{R_1} \frac{R_E}{R_A} \ln(A) \frac{V_{AGC} - V_R}{V_{REF}} \right) \quad (10)$$

is obtained.

As can be seen, the output current $I_{OUT}$ is given by the product of the constant bias current $I_{EE}$ of the second differential stage (block D), which is intrinsically temperature-stable, with the exponential function of a ratio between integrated resistors, which ratio is hence insensitive to temperature variations, of a logarithm of a pure number and of a ratio between substantially temperature-stable voltages.

The current $I_{OUT}$ is therefore particularly suitable for exercising control of the gain of an amplifier in order to effect an extremely accurate system for automatic gain control (AGC), being insensitive to temperature variations.

Figure 4:
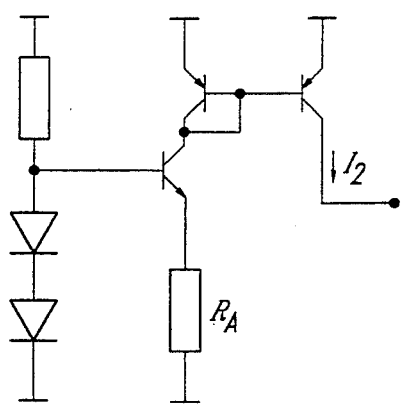
FIG. 4 is a circuit diagram of one alternative embodiment of a circuit generating a current proportional to temperature and inversely proportional to the value of an integrated resistor, alternatively usable in the circuit of the invention of FIG. 3.

FIG. 4 is an alternative circuit for block BG for providing a current proportional to temperature and inversely proportional to the value of at least one integrated resistor across the first differential stage (block C), in order to permit the desired temperature compensation. This circuit BG thus can be provided using circuits different from the band-gap circuit of FIG. 3. FIG. 4 shows a circuit alternatively suited to generating a current proportional to temperature and inversely proportional to the value of the temperature coefficient of the integrated resistors. The output current $I_2$ will in fact be given, to a good approximation, by the following equation:

$$I_2 = \frac{KT}{q} \frac{1}{RA} \quad (11)$$

Hence, this, like other circuits, will be able to be used to generate the current $I_2$ to be forced across the first differential stage T3–T4 of the circuit of the invention, as will be evident to those of ordinary skill in the art. The reference voltage, $V_R$, would be provided by some other acceptable circuit. In integrated circuits where a band-gap circuit is already present, it is advantageous to add a transistor (T5) to drive the necessary current $I_2$ across the first differential stage. However, the drive current $I_2$ can be provided by other circuits if desired.

We claim:

1. An integrated circuit for the generation of a current proportional to the difference between a signal voltage and a reference voltage and independent of temperature, which comprises:

first means able to drive a bias current directly proportional to temperature and inversely proportional to the value of at least a first integrated resistor comprised therein;

a first differential stage driven by said bias current of said first means and having a first input and a second input and a first and a second output, which is able to carry out a voltage/voltage conversion, in accordance with an exponential law, of a differential input voltage applied to said inputs;

a current generator able to drive a constant bias current essentially independent of temperature variations;

a second differential stage driven by said current generator and having a first input connected to said first output of said first differential stage and a second input connected to said second output of said first differential stage and which is able to carry out a voltage/current conversion, in accordance with an exponential law, in order to generate said output current at an output terminal, as a function of the differential voltage applied to said inputs; and a differential input circuit having a first input terminal to which is applied said signal voltage and a second input terminal to which is applied said reference voltage essentially independent of temperature, and formed by a pair of transistors connected in a common-emitter configuration, respectively biased by means of two identical generators of current respectively connected between a first supply node of the circuit and the emitters of said transistors and which are able to generate a current inversely proportional to the value of a second integrated resistor, which emitters are interconnected across said second integrated resistor, and which transistors have identical, forward-biased diodes as respective loads, respectively connected between the collectors of said transistors and a second supply node for a virtual supply node of the circuit, the differential output voltage across the collector nodes of said pair of transistors representing a current/voltage conversion provided by said forward-biased diodes, in accordance with a logarithmic law, of the respective currents flowing through the transistors of said pair and being applied to the inputs of said first differential stage, which currents represent a voltage/current conversion, in accordance with a linear/logarithmic law of the difference between said signal voltage and said reference voltage.

2. The integrated circuit as claimed in claim 1 wherein said first means able to generate a bias current directly proportional to temperature and inversely proportional to the value of at least one integrated resistor comprises a band-gap circuit and a transistor having a collector connected to a common emitter node of a pair of input transistors of said first differential stage, an emitter coupled to a supply node and a base connected to the bases of a first pair of transistors of said band-gap circuit which have their respective emitters connected to said supply node.

3. The integrated circuit as claimed in claim 1 wherein said two identical generators of current for biasing the transistors of said pair of transistors of the differential input circuit generate a current with value equal to a ratio between a constant, temperature-stable voltage and said second integrated resistor.

4. An integrated circuit for the generation of a direct current for control of the gain of an amplifier as a function of the difference between a reference voltage and a signal voltage proportional to the amplitude of the output signal from said amplifier, which comprises:

first means able to drive a bias current directly proportional to temperature and inversely proportional to the value of at least a first integrated resistor comprised therein;

a first differential stage driven by said bias current and having a first input and a second input and a first and a second output, which is able to carry out a voltage/voltage conversion, in accordance with an exponential law, of a differential input voltage applied to said inputs;

a current generator able to drive a constant bias current essentially independent of temperature variations;

a second differential stage driven by said constant bias current and having a first input connected to said first output of said first differential stage and a second input connected to said second output of said first differential stage and which is able to carry out a voltage/current conversion, in accordance with an exponential law, in order to generate said output current at an output terminal, as a function of the differential voltage applied to said inputs; and a differential input circuit having a first input terminal to which is applied said signal voltage and a second input terminal to which is applied said reference voltage, essentially independent of temperature, and formed by a pair of transistors connected in a common-emitter configuration, respectively biased by means of two identical generators of current respectively connected between a first supply node of the circuit and the emitters of said transistors and which are able to generate a current inversely proportional to the value of at least a second integrated resistor, which emitters are interconnected across said second integrated resistor, and which transistors have identical, forward-biased diodes as respective loads, respectively connected between the collectors of said transistors and a second supply node for a virtual supply node of the circuit, the differential output voltage across the collector nodes of said pair of transistors representing a current/voltage conversion provided by said forward-biased diodes, in accordance with a logarithmic law, of the respective currents flowing through the transistors of said pair and being applied to the inputs of said first differential stage, which currents represent a voltage/current conversion, in accordance with a linear/logarithmic law of the difference between said signal voltage and said reference voltage.

5. The integrated circuit as claimed in claim 4 wherein said first means able to generate a bias current directly proportional to temperature and inversely proportional to the value of at least one integrated resistor comprises a band-gap circuit and a transistor having a collector connected to a common emitter node of a pair of input transistors of said first differential stage, an emitter coupled to a supply node and a base connected to the bases of a first pair of transistors of said band-gap circuit which have their respective emitters connected to said supply node.

6. The integrated circuit as claimed in claim 1 wherein said two identical generators of current for biasing the transistors of said pair of transistors of the differential input circuit generate a current with value equal to a ratio between a constant, temperature-stable voltage and said second integrated resistor.

7. An integrated circuit for the generation of a current independent of temperature and proportional to the difference between a signal voltage and a reference voltage, which comprises:

a first and second current generators, each of said current generators generating the same current, $I_G$, the value of which is inversely proportional to the value of at least a first integrated resistor electrically coupled to said first and second current generators;

a differential input circuit having a first and second branches, said first branch coupled to and biased by said first current generator and having a first input that is connected to the signal voltage, said second branch coupled to and biased by said second current generator and having a second input that is connected to the reference voltage, said first and second branches generating a first and second output currents proportional to the difference between the signal voltage and the reference voltage;

a load circuit, electrically connected to said differential input circuit, to provide an electrical load to said differential input circuit to perform a linear to logarithmic conversion of said first and second output currents and generate a differential voltage signal proportional to temperature and said first and second output currents from said differential input circuit:

a bias current circuit to generate a bias current proportional to variations in temperature and inversely proportional to the value of at least a second integrated resistor comprised therein;

a voltage conversion circuit that generates a converted voltage, the voltage conversion circuit being electrically connected to said bias current circuit and said load circuit, driven by said bias current from said bias current circuit and receiving said differential voltage signal from said load circuit, said voltage conversion circuit performing a voltage/voltage conversion of said differential voltage signal according to an exponential law to generate said converted voltage; and an output circuit, electrically connected to said voltage conversion circuit, to receive said converted voltage and convert said converted voltage into a temperature-independent output current whose current value is proportional to the difference between said first input and said second input and is independent of temperature variations.

8. The circuit of claim 7 wherein said differential input circuit is comprised of a first and second transistors, said first transistor having an emitter coupled to said first current generator, said second transistor having an emitter coupled to said second current generator and said first resistor coupled between the emitters of said first and second transistors.

9. The circuit of claim 8 wherein said load circuit is comprised of a first and a second diode and a voltage-dropping resistor, said voltage-dropping resistor connected between a power supply and the anodes of both said first and said second diodes to provide a voltage drop, the cathode of said first diode being connected to the collector of said first transistor, the cathode of said second diode being connected to the collector of said second transistor, the output of said load circuit being a first and second signals forming said differential voltage signal proportional to temperature and said first and second output currents from said differential input circuit.

10. The circuit of claim 9 wherein said bias current circuit is a constant voltage circuit which is temperature-independent that is modified by the addition of a fifth transistor whose collector current is proportional to temperature and inversely proportional to the value of a resistor within said constant voltage circuit.

11. The circuit of claim 10 wherein said voltage conversion circuit is comprised of a fourth and fifth transistor, the emitters of both said fourth and said fifth transistors being driven by current from said bias current generator, the base of said fourth transistor being driven by said first signal from said differential output voltage from said load circuit, the base of said fifth transistor being driven by said second signal from said differential output voltage from said load circuit, a first and second load resistors of the same value having one end connected to a circuit ground, the other end of said first load resistor connected to the collector of said fourth transistor, the other end of said second load resistor connected to the collector of said fifth transistor, and generating said converted voltage.

12. An integrated circuit for the generation of a temperature independent direct current for the control of the gain of an amplifier as a function of the difference between a reference proportional to the amplitude of the output signal from said amplifier, said integrated circuit comprising:

first and second current generators, each of said current generators generating the same current, $I_G$, the value of which is temperature dependent;

a differential input circuit having a first and second branches, said first branch including a first transistor coupled to and biased by said first current generator, and having a first input that is connected to the signal voltage, said second branch including a second transistor coupled to and biased by said second current generator and having a second input that is connected to the reference voltage, said first and second branches generating a first and second output currents proportional to the difference between the signal voltage and the reference voltage;

a load circuit, electrically connected to said differential input circuit, to provide an electrical load to said differential input circuit, said load circuit comprising a first and second diode and a voltage-dropping resistor, said resistor connected between a power supply and the anodes of both said first and second diodes to provide a voltage drop, the cathode of said first diode being connected to the collector of said first transistor the cathode of said second diode being connected to the collector of said second transistor, the output of said load circuit being a first and second signals forming a differential voltage signal proportional to temperature and said first and second output currents from said differential input circuit:

a bias current circuit to generate a bias current proportional to variations in temperature and inversely proportional to the value of at least a first integrated resistor comprised therein;

a voltage conversion circuit that generates a converted voltage, the voltage conversion circuit being electrically connected to said bias current circuit and said load circuit, driven by said bias current from said bias current and receiving said differential voltage signal from said load circuit, said voltage conversion circuit performing a voltage/voltage conversion of said differential voltage signal to generate said converted voltage; and an output circuit, electrically connected to said voltage conversion circuit, to receive said converted voltage and convert said converted voltage into a temperature-independent output current whose current value is proportional to the difference between said first input and said second input and is independent of temperature variations.

13. The circuit of claim 12 wherein said bias current circuit is a constant voltage circuit which is temperature-independent that is modified by the addition of a fifth transistor whose collector current is proportional to temperature and inversely proportional to the value of a resistor within said constant voltage circuit.

14. The circuit of claim 13 wherein said voltage conversion circuit is comprised of a third and fourth transistor, the emitters of both said third and said fourth transistors being driven by current from said bias current generator, the base of said third transistor being driven by said first signal from said differential output voltage from said load circuit, the base of said fourth transistor being driven by said second signal from said differential output voltage from said load circuit, a first and second load resistors of the same value having one end connected to a circuit ground, the other end of said first load resistor connected to the collector of said third transistor, the other end of said second load resistor connected to the collector of said fourth transistor, and generating said converted voltage.

* * * * *